United States Patent [19]

Halttunen et al.

[11] Patent Number: 5,687,470
[45] Date of Patent: Nov. 18, 1997

[54] METHOD FOR FORMING AN RF SHIELDED ENCLOSURE

[75] Inventors: Mikko Veijo Tapani Halttunen, Oulu; Markku Gunnar Kankaanpää, Salo, both of Finland

[73] Assignee: Nokia Mobile Phones Limited, Espoo, Finland

[21] Appl. No.: 972,145

[22] Filed: Nov. 5, 1992

[30] Foreign Application Priority Data

Nov. 6, 1991 [FI] Finland .................. 915242

[51] Int. Cl.⁶ .................. H01S 4/00; H05K 9/00
[52] U.S. Cl. .................. 29/592.1; 228/179.1; 427/207.1; 174/35 R; 361/818
[58] Field of Search .................. 257/659, 660, 257/699, 704; 174/35 R, 35 GC, 35 MS, 52.1, 52.3, 52.4; 361/424, 800, 816, 818; 427/207.1, 208, 208.2, 208.4, 208.6; 228/179.1, 180.1, 180.21, 180.22; 29/592.1

[56] References Cited

U.S. PATENT DOCUMENTS

| | | | |
|---|---|---|---|
| 3,469,015 | 9/1969 | Warren | 174/35 |
| 4,567,318 | 1/1986 | Shu | 174/35 GC |
| 4,739,453 | 4/1988 | Kurokawa | 361/424 |
| 4,868,637 | 9/1989 | Clemens et al. | 174/88 R |
| 4,999,136 | 3/1991 | Su et al. | 252/512 |

FOREIGN PATENT DOCUMENTS

| | | | |
|---|---|---|---|
| 0275171 | 7/1988 | European Pat. Off. | H05K 9/00 |
| 915242 | 5/1992 | Finland . | |
| 62-86841 | 4/1987 | Japan | 257/659 |
| 1282697 | 4/1972 | United Kingdom | H05K 9/00 |
| 2187893 | 9/1987 | United Kingdom | H05K 9/00 |
| 2200253 | 7/1988 | United Kingdom | H05K 9/00 |
| 2209436 | 5/1989 | United Kingdom | H05K 9/00 |
| 2237147 | 4/1991 | United Kingdom | H05K 9/00 |

*Primary Examiner*—Bot L. Ledynh
*Attorney, Agent, or Firm*—Perman & Green, LLP

[57] ABSTRACT

A method of providing a cover on a substrate to shield against radio frequency radiation, wherein an electrically conductive material—such as a conductive, possibly adhesive, paste—which shields against RF radiation is applied in a fluid state to the desired area of the substrate. The substrate may be a printed circuit board (1) or a base member of an RF housing.

10 Claims, 2 Drawing Sheets

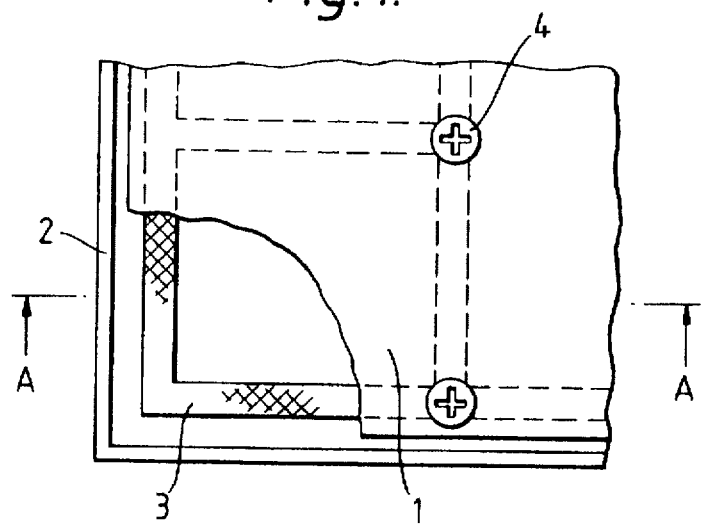
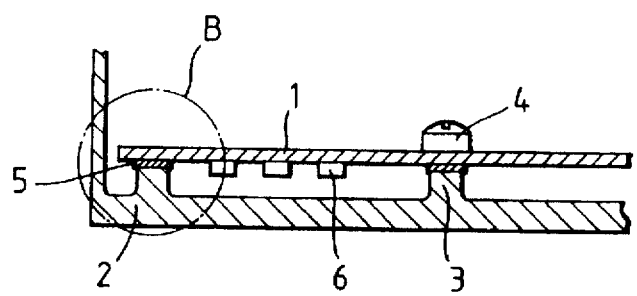
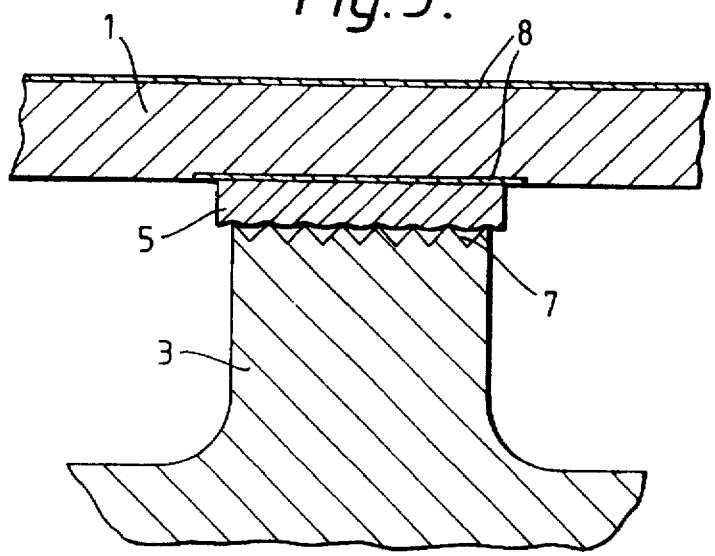

METHOD FOR FORMING AN RF SHIELDED ENCLOSURE

The present invention relates to an RF shielding cover and a method of providing a cover on a base member by the application of an electrically conductive material which shields against RF (radio frequency) radiation.

BACKGROUND OF THE INVENTION

A printed circuit board with electronic components operating within the RF range is usually mounted in a metal housing, in order to shield the components against external interference such as RF radiation and also in order to prevent any radiation from passing from the housing to the surroundings. The housing may be divided into a plurality of compartments by means of partition walls. The housing and the compartments are usually closed using a metal cover. In order to achieve adequate RF shielding, an RF-shielding strip of an electrically conductive material is fitted between the housing and the cover. One such arrangement is shown in U.S. Pat. No. 4,945,633.

In known arrangements, a pre-shaped RF-shielding strip (gasket) is installed in place manually. This is a slow working step with a high personnel capacity requirement. In addition, the completed strip will have been given a high degree of finish by the manufacturer, a fact which is reflected in the price of the product.

RF leakage into or out of an RF shielded area of a printed circuit board will occur predominantly through RF leakage paths at the interfaces between structural parts of an electronic device, such as for example between; the circuit board and the shielding housing; the wall of the shielding housing and the cover of the shielding housing; the circuit board and the shielding housing; and the circuit board and the wall of the shielding housing.

SUMMARY OF THE INVENTION

According to the present invention there is provided a method providing a cover on a base member to shield against radio frequency (RF) radiation, wherein an electrically conductive RF shielding material is provided between the cover and the base member, characterized in that the electrically conductive RF shielding material is provided in a substantially fluid form.

An advantage of the invention is the substantial elimination of the disadvantages inherent in the prior art and the provision of a method by which RF shielding can be implemented efficiently, simply and economically.

The shielding material used is preferably applied by using a printing technique, an extrusion technique or is applied to an edge of the cover by placing said edge in an adhesive shielding material.

Suitable shielding materials include various electrically conductive plastics, adhesives and elastomers, metallized plastics and carbon paste, as well as other polymer pastes. One suitable material is carbon-silver paste. Depending on the material, it may be necessary to harden the mix by means, for example, of UV light.

When an extrusion technique is used, the mix must be a fluid of a suitable viscosity to enable it to be applied by means of an extruding apparatus. Such a fluid would include a paste. Through out this specification the term "fluid" is intended to include a paste.

When a printing technique is used, the requirements set on the material are dependent on, for example, the printed circuit board application, the welding process, and the construction of the device.

If an adhesive paste is used the cover may be placed in the adhesive paste so that the past adheres to the peripheral edge of the wall of the cover before the cover is placed on the base member.

The material maybe applied directly onto the printed circuit board by a printing technique in connection with the process of manufacturing the printed circuit board.

The housing may be a metal housing or a housing made of metallized plastic. The housing may have a plurality of compartments separated from each other by walls. In this connection, the word 'housing' refers in the main to a case-like structure, but when a plurality of printed circuit boards is involved, the word 'housing' also refers to a housing, located between the printed circuit boards to improve the stiffness of the structure.

Grooves or other recesses may be made on the upper surface of the housing wall facing the printed circuit board, in which case the RF-shielding material will sink into the recesses, thereby improving the seal and the contact.

BRIEF DESCRIPTION OF THE DRAWINGS

Embodiments of the invention is described below in greater detail, by way of example, with reference to the accompanying drawings, in which:

FIG. 1 depicts a schematic partial top view of a printed circuit board mounted in a housing with an RF-shield in accordance with the invention;

FIG. 2 depicts a section through A—A in FIG. 1;

FIG. 3 depicts area B of FIG. 2, on an enlarged scale;

DETAILED DESCRIPTION OF THE INVENTION

Figure 4:
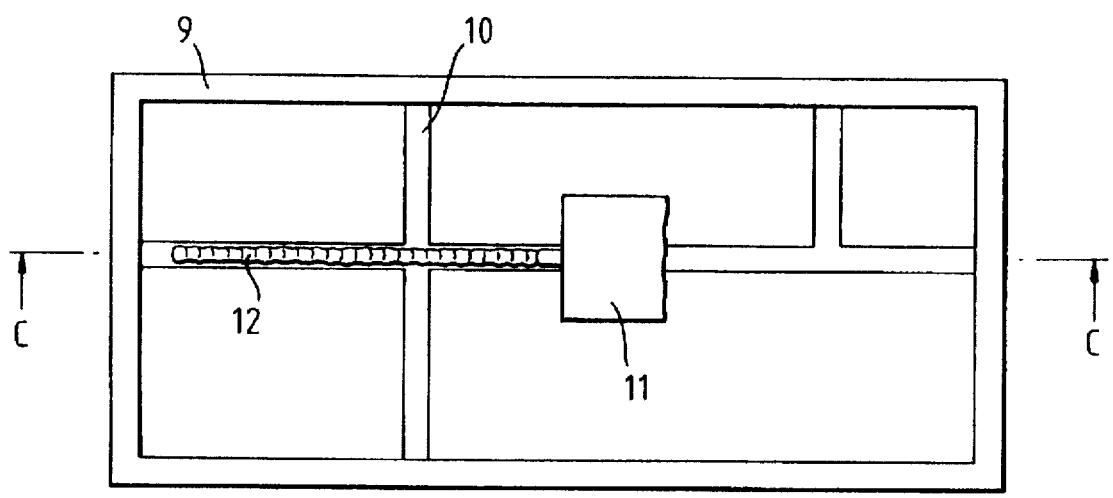
FIG. 4 depicts a schematic top view of the application of an RF shielding mix to a housing, in accordance with the invention.

FIGS. 1 to 3 depict a printed circuit board 1 mounted, in accordance with the invention, in a metal or metallized housing 2 with an RF-shield, there being components 6 on one side of the printed circuit board. The housing has a plurality of compartments, which are separated from each other by walls 3.

Between the printed circuit board 1 and the housing walls 3 there is a sealing, electrically conductive, RF-shielding mix 5, which has been applied, for example, by printing technique either in those areas of the printed circuit board 1 which come against the walls 3 or on the upper surfaces of the walls 3 which come against the printed circuit board.

In the upper surfaces of the housing walls 3 there may be grooves 7 or other recesses, in which case the shielding mix 5 will sink into the recesses, thereby improving the seal and the contact (FIG. 3). The upper surface of the printed circuit board 1 and those areas of its lower surface which are in contact with the RF-shielding mix 5 are coated with copper 8 (FIG. 3).

The printed circuit board 1 is secured to the housing 2, for example, by means of screws 4, whereby there is formed between the printed circuit board and the housing, in the area of the shielding mix 5 and the housing wall 3, an electrical contact or a contact which prevents the passing of radiation from one compartment to another, or out of a compartment.

Figure 5:
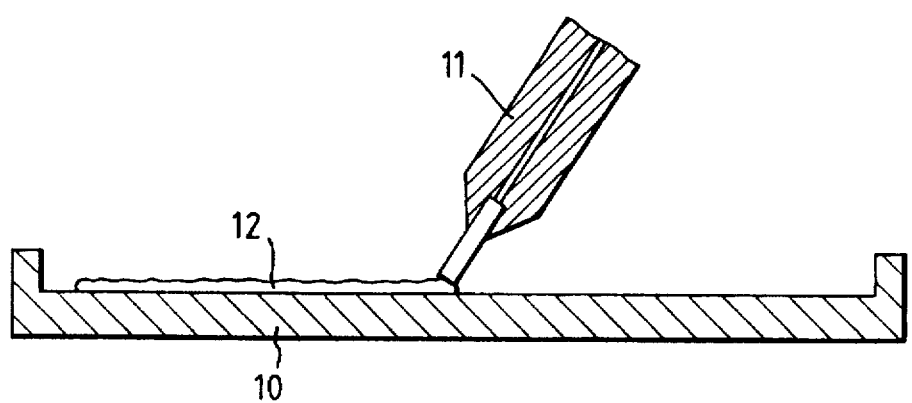
FIG. 5 depicts a section through C—C in FIG. 4.

In the embodiment depicted in FIGS. 4 and 5, the electrically conductive mix 12 is extruded by means of an "In line" or "On line" automatic dispensing apparatus 11 onto the upper surfaces of the walls 10 of a housing 9 having a plurality of compartments, in order to provide a sealing RF-shielding mix. The printed circuit board is then secured to this housing, for example in a manner corresponding to that depicted in FIGS. 1 to 3, whereby tight RF shielding is produced between the printed circuit board and the housing. By this technique the electrically conductive mix can also be extruded onto the cover in order to provide a sealing RF-shielding mix between the cover and the housing. The dispensing (quantity, capacity) of the mix can be regulated by means of nozzle size, extrusion pressure, or by a predetermined program.

The term "paste" is particularly intended to include carbon paste or adhesive conductive paste.

In view of the foregoing it will be clear to a person skilled in the art that modifications may be incorporated without departing from the scope of the present invention.

We claim:

1. A method of connecting two members to each other to form an RF shielded enclosure comprising steps of:
   providing a first one of the two members with a plurality of recesses along an edge of a wall of the first member;
   applying an electrically conductive fluid at an area of a second one of the two members that is intended to mate with the edge of the first member's wall; and
   connecting the two members to each other with the electrically conductive fluid being sandwiched between the two members and extending, at least partially, into the recesses along the first member's wall.

2. A method as in claim 1 wherein the step of applying the electrically conductive fluid comprises applying an electrically conductive paste at the area of the second member.

3. A method as in claim 1 wherein the step of applying the electrically conductive fluid comprises applying an RF shielding adhesive material.

4. A method as in claim 1 wherein the step of applying the electrically conductive fluid comprises printing the fluid onto the area.

5. A method as in claim 1 wherein the step of applying the electrically conductive fluid comprises extruding the fluid onto the area.

6. A method of connecting two members to each other to form an RF shielded enclosure comprising steps of:
   providing a first one of the two members with a plurality of recesses along an edge of a wall of the first member;
   applying an electrically conductive fluid along the edge of the wall; and
   connecting the two members to each other with the electrically conductive fluid being sandwiched between the two members and extending, at least partially, into the recesses along the first member's wall.

7. A method as in claim 6 wherein the step of applying the electrically conductive fluid comprises applying an electrically conductive paste at the edge of the wall.

8. A method as in claim 6 wherein the step of applying the electrically conductive fluid comprises applying an RF shielding adhesive material.

9. A method as in claim 6 wherein the step of applying the electrically conductive fluid comprises printing the fluid onto the wall.

10. A method as in claim 6 wherein the step of applying the electrically conductive fluid comprises extruding the fluid onto the wall.

* * * * *